United States Patent [19]

Gieskes et al.

[11] Patent Number: 5,852,869

[45] Date of Patent: *Dec. 29, 1998

[54] METHOD AND APPARATUS FOR SUPPLYING AND PLACING COMPONENTS

[75] Inventors: Koen A. Gieskes; Daniel Whitney Ackerman, both of Binghamton, N.Y.

[73] Assignee: Universal Instruments Corporation, Binghamton, N.Y.

[*] Notice: The term of this patent shall not extend beyond the expiration date of Pat. No. 5,649,356.

[21] Appl. No.: 831,007

[22] Filed: Mar. 31, 1997

Related U.S. Application Data

[63] Continuation-in-part of Ser. No. 532,145, Sep. 22, 1995, Pat. No. 5,649,356.

[51] Int. Cl.$^6$ .................................................. H05K 3/30
[52] U.S. Cl. .............................. 29/834; 29/740; 29/743; 29/834
[58] Field of Search .............................. 29/739, 740, 833, 29/834, 710, 743, 64.1, 759, 760, 712; 269/403; 294/64.1; 414/224, 737

[56] References Cited

U.S. PATENT DOCUMENTS

| | | |
|---|---|---|
| 4,282,965 | 8/1981 | Bates et al. . |
| 4,282,966 | 8/1981 | Bates et al. . |
| 4,434,887 | 3/1984 | Yager . |
| 4,611,397 | 9/1986 | Janisiewicz et al. . |
| 5,044,875 | 9/1991 | Hunt et al. . |
| 5,105,528 | 4/1992 | Soth et al. . |
| 5,649,356 | 7/1997 | Gieskes .................................. 29/834 X |

FOREIGN PATENT DOCUMENTS

| | | | |
|---|---|---|---|
| 4-107000 | 4/1992 | Japan ........................................ 29/739 |
| 6-21691 | 1/1994 | Japan ........................................ 29/739 |

OTHER PUBLICATIONS

Universal Instruments Corporation Product Specification Manual (GS–340–00E) "General Surface Mount Application Machine (GSM1)"; undated (copyright 1995).

*Primary Examiner*—Peter Vo
*Assistant Examiner*—Rick Kiltae Chang
*Attorney, Agent, or Firm*—Banner & Witcoff, Ltd.

[57] ABSTRACT

A method and apparatus for automatically supplying surface mount chip components from a bulk feeder and placing the chip components on a substrate. The apparatus includes a base frame, a substrate feeding mechanism, a placement head, and a placement head positioning system. The substrate feeding mechanism delivers substrates to a component receiving position on the base frame. The placement head is translationally movable with respect to the base frame and includes a component supplying and placing mechanism, to supply components and place components on a substrate in a desired location. The component supplying and placing mechanism includes a component transfer mechanism, a component feeder, and a vacuum spindle. The transfer mechanism includes a rotatable wheel with a plurality of component holding compartments, a plurality of angularly disposed stations, and a drive mechanism for sequentially moving the compartments to at least a component receiving station and a component delivery station. The feeder receives a plurality of components from a container and feeds the components in a desired orientation to the receiving station of the transfer mechanism. The vacuum spindle is disposed above the delivery station of the transfer mechanism, and is vertically movable with respect to the delivery station for controlling and placing a component at the delivery station onto the substrate.

2 Claims, 5 Drawing Sheets

5,852,869

METHOD AND APPARATUS FOR SUPPLYING AND PLACING COMPONENTS

This application is a continuation in part of U.S. Ser. No. 08/532,145, filed Sep. 22, 1995, now is U.S. Pat. No. 5,649,356.

FIELD OF THE INVENTION

The present invention relates to a method and apparatus for placing components, and more specifically, to a method and apparatus for automatically supplying surface mount chip components from a bulk feeder and placing the chip components on substrates at high speed.

BACKGROUND OF THE INVENTION

Existing apparatus for supplying and placing electrical surface mount components typically include a frame, a board handling system for supplying circuit boards, a plurality of component feeders, and one or more placement heads. The plurality of component feeders are normally fixed to the frame and supply components to respective feeder pick-up position. The placement head or heads are movable laterally and longitudinally, i.e., in the X and Y coordinate axes, and have at least one vacuum spindle thereon which is movable vertically, i.e., in the Z coordinate axis and rotationally around the Θ axis, to place the components onto a circuit board. The placement head shuttles between the component feeder pick-up positions where it picks-up one or more components and the designated positions above the substrate where the vacuum spindles place the picked-up components onto the substrate. However, these "pick-and-place" surface mount machines do not maximize high speed placement capabilities as the placement head must continuously shuttle between the component pick-up position and the designated placement positions above the substrate.

Prior pick-and-place surface mount machines which fall within the above described classification include machines which are manufactured and marketed by Universal Instruments Corporation of Binghamton, N.Y. under the designation "General Surface Mount Application Machines" GSM-1.

In these machines, bulk components are fed to a pick position by loose component feed devices. Escapement mechanisms such as a rotary wheel affixed to the end of loose feeders are used to separate the components for pick up by the placement head.

Additional prior art includes U.S. Pat. No. 5,044,875 to Hunt et al. disclosure of a method and apparatus for positioning electrical components 32 in which a magazine 34 of stacked electrical components is coupled to, and movable with, a vacuum tube 36. As depicted in FIG. 1, the magazine 34 receives a plurality of chips 32 arranged in a vertical stack. The weight of the stack assists the downward gravity feed of components. A sliding block 38 reciprocates along an axis 40 between a position under the stack and a position under a vacuum tube 36. Initially, the sliding block is positioned beneath and adjacent to the vertical stack of chips. The sliding block 38 is moved towards the vacuum tube 36. Such movement causes a projection 44 on the sliding block 38 to strip the lowermost chip from the bottom of the magazine, and move the chip toward the vacuum tube 36. The vacuum applied through tube 36 causes the chip to move upward against the vacuum tube 36. The sliding block 38 is moved back to its initial position below the magazine 34, and the chip is transported downward by the tube 36 until it is pressed into a circuit board at the desired site. Upon pressing the chip into the circuit board site, the vacuum is discontinued and the tube 36 is vertically raised to its initial position above chamber 42.

While this arrangement does not apparently need to shuttle a pick-and-place head between a pick station and a place station between each deposited component, it does include a number drawbacks. First, because the chips are vertically stacked, they are susceptible to the phenomenon of adhering together. This can cause the chips to hang up in the supply magazine, or to fail during the chip feed or stripping operations. Further, this arrangement is limited to feeding and placing a small number of chips in a neatly stacked magazine, and fails to provide a way to permit the feeding and depositing of a large number of components which are stored in bulk form, i.e., randomly oriented in a cartridge. Additionally, the reciprocating nature of the sliding block between only a receiving and delivery station may be disadvantageous by failing to provide suitable electronic chip component inspection and detection capabilities at intermediate stations.

Therefore, a translating placement head machine for supplying components and placing the components on a substrate at high speed with a minimum of reloading down time was needed which would eliminate the need to shuttle between a pick station and a place station, and would permit the feeding of a large number of components from a bulk source and facilitate the detection of properly supplied components. The present invention was developed to accomplish these and other objectives.

SUMMARY OF THE INVENTION

In view of the foregoing, it is a principal object of the present invention to provide a translationally movable high speed placement head for supplying and placing chip components on a substrate, which does not require shuttling to a pick station for chip component replenishment after each placement of a chip component on the substrate at a place location.

It is a further object of the invention to provide a translationally movable high speed placement head which contains a bulk chip component feeder coupled thereto for supplying and placing chip components on a substrate.

It is another object of the invention to provide a high speed placement head which supplies and places chip components on a substrate, and facilitates the detection and inspection of properly supplied chip components.

These and other objects are achieved by the present invention which, according to one aspect, provides an apparatus for supplying chip components and placing the components on a substrate. The apparatus is translationally movable with respect to the substrate, and includes component transfer mechanism, component feeder, and a vacuum spindle. The transfer mechanism includes a rotatable wheel with a plurality of component holding compartments, a plurality of angularly disposed stations, and a drive mechanism for sequentially moving the compartments to the stations. The stations include at least a component receiving station and a component delivery station. The feeder has a container for storing a large number of chip components, and the feeder advances the components to the receiving station of the transfer mechanism. The vacuum spindle is disposed above the delivery station of the transfer mechanism, and is vertically movable with respect to the delivery station for controlling and depositing a component at the delivery station onto the substrate. The feeder, the transfer mechanism, and the vacuum spindle are structurally coupled as a unit such that translational movement of the apparatus with respect to the substrate causes the unit to move translationally with respect to the substrate. The transfer mechanism includes a rotatable wheel with a plurality of component holding compartments, a fixed outer ring concentrically disposed around the rotatable wheel, a plurality of angularly disposed stations, and a drive mechanism for sequentially moving the compartments to at least a component receiving station and a component delivery station. The outer ring includes an aperture at the receiving station permitting the transfer of a component from the feeder to a holding compartment. The feeder contains a large number of components and feeds the components to the receiving station of the transfer mechanism. The feeder includes a bulk component container which stores components in loose bulk form, and a feeding section which aligns and feeds the components to the transfer mechanism at the receiving station in a desired orientation. The vacuum spindle is disposed above the delivery station of the transfer mechanism, and is vertically movable with respect to the delivery station for controlling and placing a component at the delivery station onto the substrate.

The placement head is positioned at a first predetermined location above the substrate, and a first component is delivered from the feeder exit point to a compartment at a receiving station on the transfer mechanism. The transfer mechanism is rotated sequentially to move the first component from the receiving station on the transfer mechanism to a delivery station on the transfer mechanism. During each sequential dwell period additional components exit the feeder into proceeding compartments on the transfer mechanism. The first component is controlled by the vacuum spindle at the delivery station of the transfer mechanism and is placed onto the substrate. The placement head is moved to a second predetermined position above the substrate and the transfer mechanism is rotated to move the second component in the transfer mechanism to the delivery station and the second component is controlled at the delivery station by the vacuum spindle and placed onto the substrate at a second predetermined location.

These and other objects and features of the invention will be apparent upon consideration of the following detailed description of preferred embodiments thereof, presented in connection with the following drawings in which like reference numerals identify like elements throughout.

DETAILED DESCRIPTION OF THE PREFERRED EMBODIMENT

Figure 1:
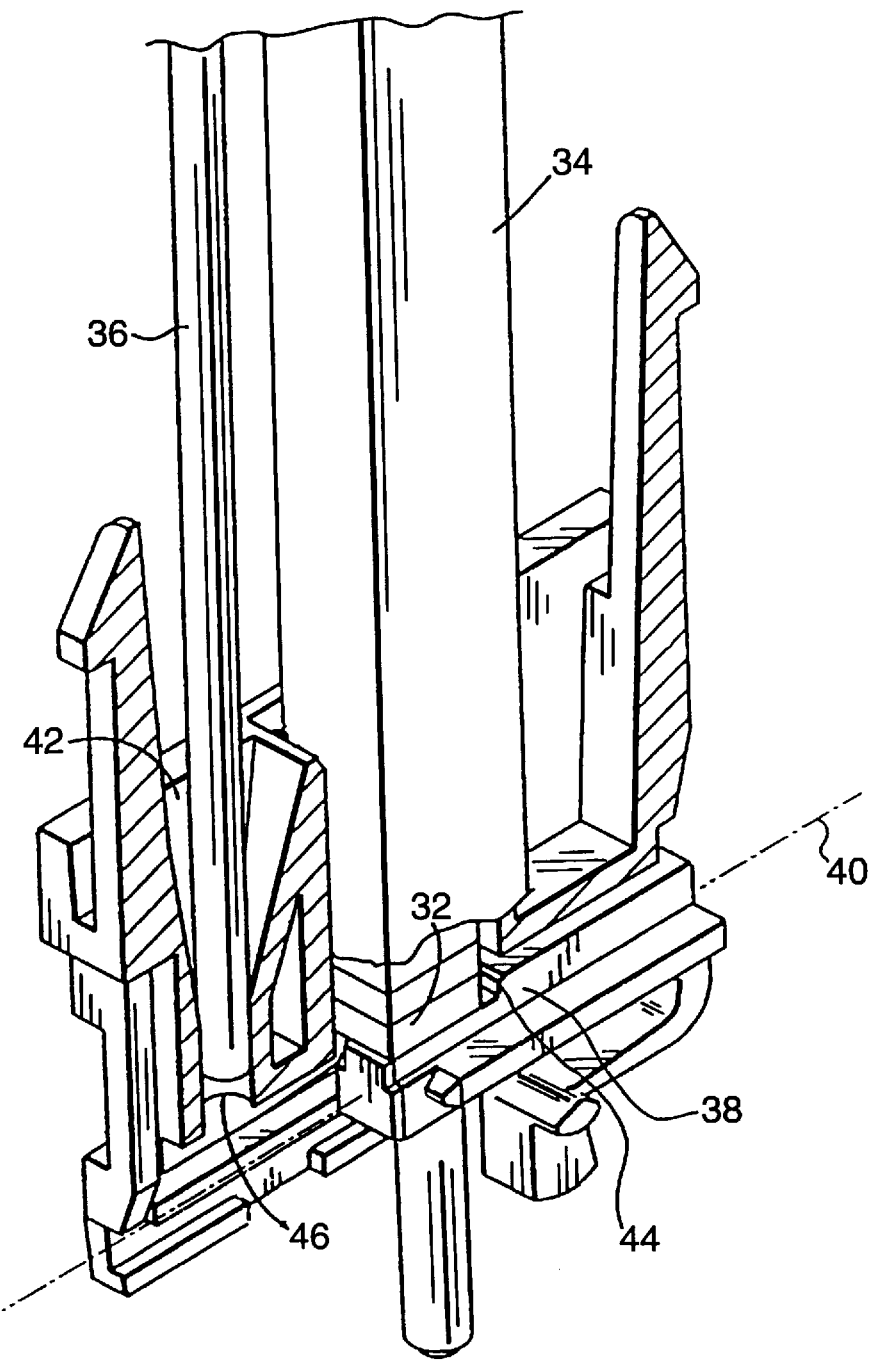
FIG. 1 is a perspective view of the prior art device of the Hunt U.S. Pat. No. 5,044,875.

An apparatus for supplying and positioning electrical components of the present invention is pictured in FIGS. 2–10, and is designated generally by reference numeral 50. Specifically referring to FIG. 2, the electrical component supplying and placing apparatus 50 includes a feeder and placement head 52 movable in relation to base frame 53. An X and Y axis positioning system 54 moves feeder and placement head 52 with respect to base frame 53 in at least the X and Y axes. In one preferred embodiment, the X and Y axis positioning system 54 is an overhead gantry style positioning system. Positioning systems of this type are well known in the art, and the specific positioning system utilized is not critical to the invention.

The feeder and placement head 52 supplies, positions, and places chip components on substrate boards 60. Substrate boards 60 are transferred to and from a predetermined position on the base frame 53 by a substrate moving system 62 which is preferably an automatic conveyor. Substrate moving systems of this type are well known in the art, and the specific substrate moving system utilized forms no part of this invention and further description is not believed necessary to understand the construction and operation of the invention.

Figure 2:
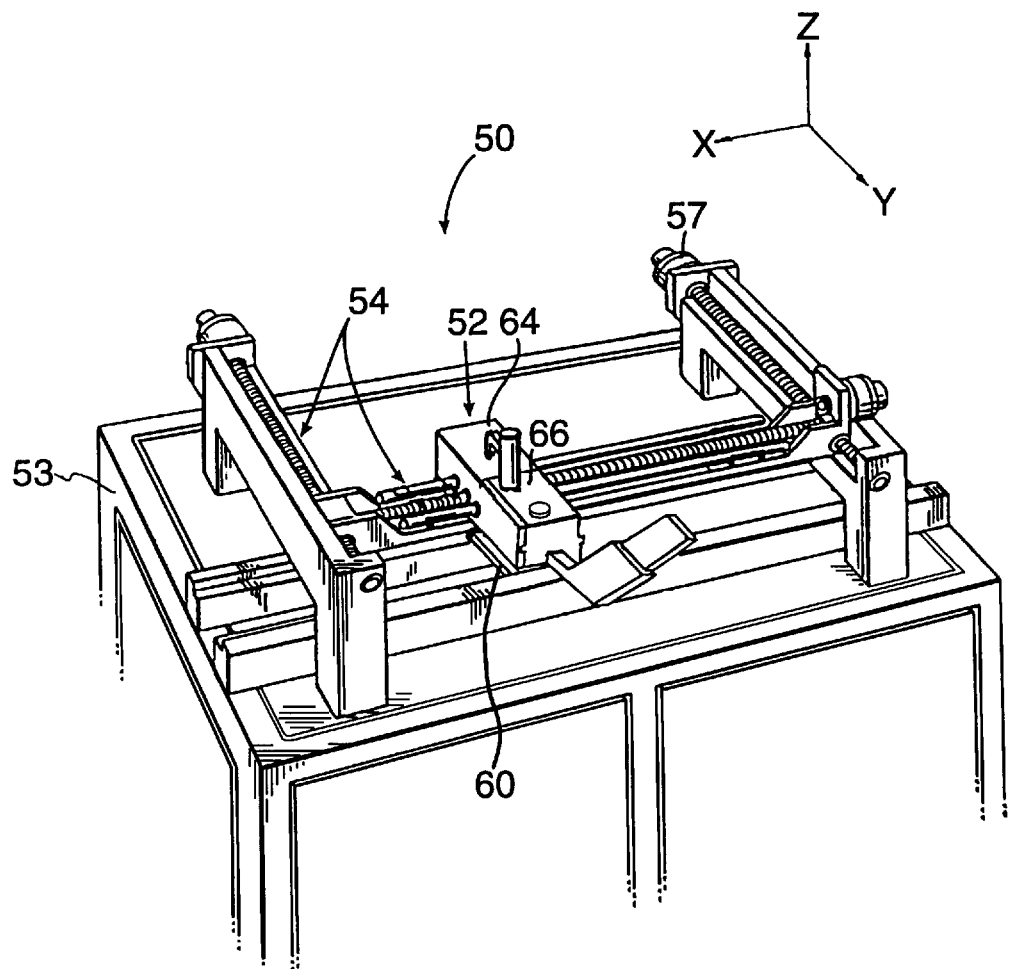
FIG. 2 is a perspective view of an apparatus for supplying and positioning electrical chip components according to the present invention.
Figure 3:
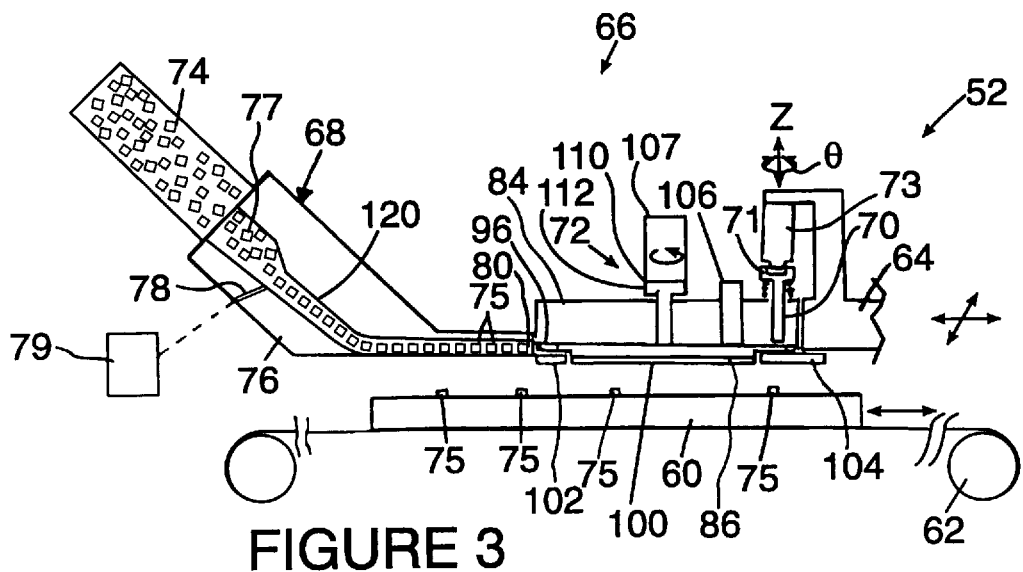
FIG. 3 is a schematic partial side elevational view of the apparatus of FIG. 3.

Referring to FIGS. 2 and 3, the feeder and placement head 52 includes a block or base section 64, and at least one component feeder and placement head attached to the base section 64. In the embodiment shown in FIG. 2, one component feeder and placement head 52 is coupled to the base section 64. However, it is recognized that more than one component feeder and placement heads 52 could be used. The component feeder and placement head 52 is preferably individually removably coupled to base section 64 by a conventional sliding connection having any conventional retaining or locking arrangement. Accordingly, base section 64 may include projecting guides which are shaped complementary to the individual component feeder and placement head 52 to facilitate replacement and alignment. It is also recognized that the individual component feeder and placement head 52 are preferably electronically coupled to a controller, as described hereinafter, for power and signal requirements.

Figure 4:
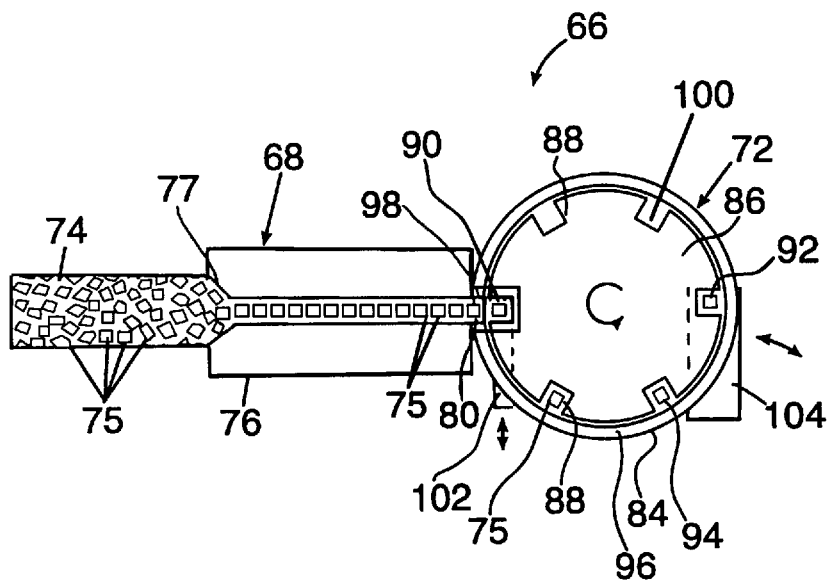
FIG. 4 is a schematic partial top plan view of the apparatus of FIG. 3.

As illustrated in FIGS. 3 and 4, each component feeder and placement head 52 includes a bulk component feeder 68, a spindle 70, and a chip component transfer mechanism 72. In sum, the bulk component feeder 68 transfers chip components 75 individually from a container 74 containing a large number of chip components 75 in a bulk form, i.e., a non-organized or random arrangement, to the chip transfer mechanism 72. The chip transfer mechanism 72 transfers the chip components 75 from the component feeder 68 to position immediately below the spindle 70 such that the chip components 75 can be individually engaged and controlled by the spindle 70. The spindle 70 may be coupled to a vacuum source (not shown), which may be selectively applied as a function of the position of the spindle 70. A spindle drive system 73 moves the spindle 70 in the Z axis and about its longitudinal axis Θ to control and place the chip component 75 onto a substrate 60. It should be noted that the spindle 70 is depicted as having an upper portion 71 which is engagable with spindle drive system 73 and a lower portion which is retained in transfer mechanism 72. Alternatively, the entire spindle 70 may be coupled directly to the base section 64 separate from the removable portion of the component feeder and placement head 52.

The bulk component feeder 68 includes a container 74 and a body section 76. Container 74 is removably attached to the body section 76 permitting the restocking of chip components 75 without the need to remove the component feeder and placement head 52 from the base section 64. Inside an input chamber 77 of the body section 76, the chip components 75 are fed from a random orientation to a predetermined and desired orientation, and are aligned into a single row in channel 120 due to the inherent shape of the input chamber 77. The components are then fed along channel 120 to the exit 80 of the base section 76 by forced air from a source 79 connected to a plenum 78 in body section 76. At the exit 80 of component feeder 68, the channel 120 feeding the chip components 75 is substantially horizontal such that the chip components 75 are fed horizontally to the chip transfer mechanism 72. A preferred container 74 and feeder 68 design of the type shown and described is commercially available and is manufactured in Japan by NITTO Kogyo in Japan.

Figure 5:
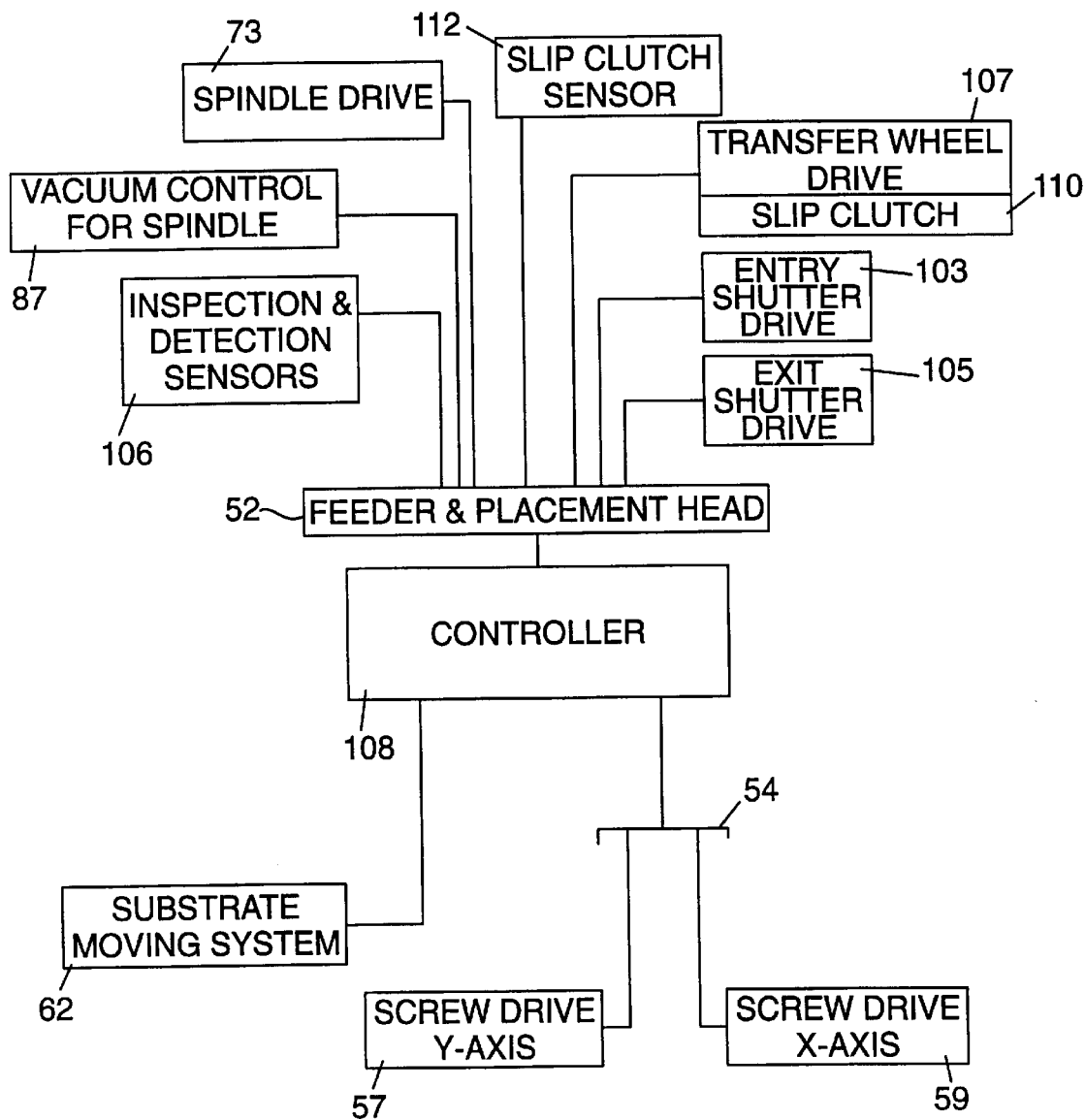
FIG. 5 is block diagram depicting the control system for the apparatus of FIG. 3.
Figure 6:
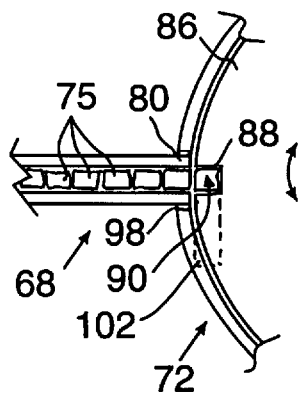
FIG. 6 is an enlarged view of the interface between the bulk feeder and the chip transfer mechanism shown in FIG. 4.

Chip transfer mechanism 72 includes a frame 84 and a transfer wheel 86 journaled in frame 84 for rotational movement with respect thereto. Transfer wheel 86 includes a plurality of angularly spaced component holding compartments 88 which are located adjacent the periphery of transfer wheel 86 and are sized to be slightly larger than the chip components 75 which they are intended to receive. In one preferred embodiment, as shown in FIG. 5, the component holding compartments 88 are angularly spaced at 60° increments. However, the angular spacing between component holding compartments 88 can be more or less than 60°.

Incremental rotation of the transfer wheel 86 causes the component holding compartments 88 to be transferred to various "stations" positioned around the transfer wheel 86. The stations include, at least, a receiving station 90 adjacent the exit 80 of the feeder 68, and a delivery station 92 adjacent the spindle 70. In addition, there may be one or more stations 94 between the receiving station 90 and the delivery station 92 for inspecting, detecting, and/or testing the chip components 75 in their component holding compartments 88.

The frame 82 of the chip transfer mechanism 72 includes an outer ring 96 which maintains the chip components 75 in their component holding compartments 88 in their travel from the receiving station 90 to the delivery station 92. An opening or gap 98 in the outer ring 96 is located adjacent the receiving station 90. This permits a chip component 75 to enter component holding compartment 88 disposed at the receiving station 90 through the gap 98 in the outer ring 96. The outer ring 96 also includes lower supporting structure 100, located beneath at least a portion of the transfer wheel 86, which supports the chip components 75 inside the component holding compartments 88 as they travel from the receiving station 90 to the delivery station 92. Lower supporting structure 100 is preferably comprised of a stationary portion, an entry shutter 102, and an exit shutter 104.

The entry and exit shutters 102 and 104 are movably mounted, preferably either pivotally mounted or slidably mounted, to the frame 84 adjacent the receiving station 90 and the delivery station 92, respectively. The shutters 102 and 104 are movable between a component supporting position in which they can support a chip component 75 in a component holding compartment 88 at their respective station 90 or 92, and a component discharge position wherein a chip component 75 can pass or drop downwardly from its respective station 90 or 92. Each shutter 102 and 104 is driven by a respective drive system 103 and 105 (FIG. 5) for movement between component supporting and discharge positions. As described hereinafter, the entry shutter 102 is typically opened, i.e., moved to its component discharge position, to discharge a component which may not entirely enter a component holding compartment 88 and thus interrupt the incremental rotation of transfer wheel 86. The exit shutter 104 is typically opened, i.e., moved to its component discharge position, to permit the vacuum spindle 70 to control and place a chip component 75 onto the substrate 60 by passing through a vertical passageway in the frame 84 created by the open exit shutter 104. The shutters 102 and 104 and their respective drives systems 103 and 105 may be any known structural arrangement for accomplishing the aforementioned functions, and either or both of the shutters 102 and 104 may be reciprocatory or oscillatory.

One or more sensors 106 may be positioned adjacent an intermediate station 94, at or between receiving station 90 and delivery station 92 for detecting, testing, and/or inspecting a chip component 75 in a component holding compartment 88. These sensors 106 are coupled to the shutter drive mechanisms 103 and 105 to discharge chip components 75 and/or to "double index" the transfer wheel 86 a desired number of times when a chip component 75 is absent from a component holding compartment 88 at delivery station 92.

As seen in FIG. 5, a controller 108 is coupled to the screw drives 57 and 59, the substrate moving system 62, and component feeder and placement head 52. More specifically, with respect to the component feeder and placement head 52, the controller 108 is coupled to an incremental transfer wheel drive 107 having a slip clutch 110, and a slip clutch sensor 112 for detecting activations or slippages of the slip clutch 110. Further, with respect to the component feeder and placement head 52, the controller 108 is coupled to the shutter drive systems 103 and 105, the spindle drive system 73 and the vacuum control 87 for selectively applying a vacuum to the spindle 70, and various inspection, testing, and/or detection sensors collectively indicated by reference numeral 106. Controller 108 preferably includes well-known sequential or combination logic circuitry, a microprocessor, a programmable logic array, or other known control circuitry.

In operation, the container 74 is preferably initially filled with electrical chip components 75. Chip components 75 are allowed to feed from container 74 to chamber 77. Pressurized air via air source 79 and plenum 78, forces the chip components 75 from chamber 77 to channel 120 in a desired orientation to the exit 80. At the receiving station 90, the leading chip component 75 is forced, via air assist, into a component holding compartment 88 of the transfer wheel 86 through the opening 98 in the outer ring 96. The leading chip component 75, now located in component holding compartment 88 at the receiving station 90, is supported from below by supporting structure 100 which preferably includes entry shutter 102.

The transfer wheel 86 is incrementally advanced, i.e., indexed, one angular increment so that the component holding compartment 88 at the receiving station 90 moves the leading chip component 75 from channel 120. The indexing simultaneously causes the component holding compartment 88 advance to the next station and a new empty component holding compartment 88 to arrive at the receiving station 90. The next chip component 75 from channel 120 enters the next component holding compartment 88 upon arrival at receiving station 90. This process continues until the first chip component 75 reaches the delivery station 92.

In the event that a chip component 75 does not enter the component holding compartment 88 properly and jams the transfer wheel 86, the slip clutch 110 will prevent the transfer wheel 86 from rotating. After a predetermined number of consecutive slippages, as detected by slip clutch sensor 112, the entry shutter 102 is moved to its component discharge position to discharge the defective and/or misaligned chip component 75, and permit entry of the succeeding chip component 75.

The X and Y positioning system 54, including the screw drives 57 and 59, positions the multi-feeder and placement head 52 so that the chip component 75 at the delivery station 92 is superimposed above its desired location on the substrate 60 for placement thereon. Details of the chip component placement process is first described for the embodiment including an exit shutter 104, with reference to FIGS. 7 and 8, and is later described for an embodiment without an exit shutter, with reference to FIGS. 9 and 10.

Figure 7:
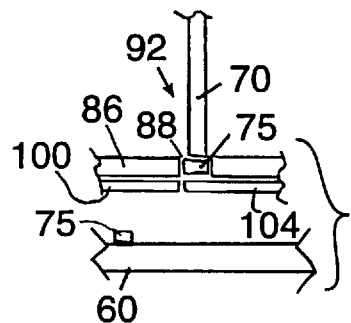
FIG. 7 is a side elevational view depicting the interface between the chip transfer mechanism and the spindle in a first operational state.
Figure 8:
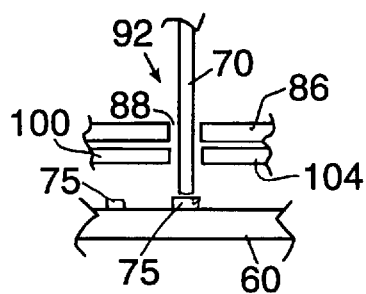
FIG. 8 is a side elevational view depicting the interface between the chip transfer mechanism and the spindle in a second operational state.

If an exit shutter 104 is used, as shown in the embodiment of FIGS. 7 and 8, the chip component 75 arriving at the delivery station 92 will initially rest on the exit shutter 104, which is in its component supporting position. The vacuum spindle 70 engages the top of the chip component 75 and controls and retain it by an applied vacuum. The exit shutter 104 is moved to its component discharge position to provide an unobstructed vertical passage to the substrate 60. The spindle 70 is lowered through the passage and the chip component 75 is placed on the substrate 60. The spindle 70 is then retracted, and the exit shutter 104 is returned to its component supporting position to await the next chip component 75.

Figure 9:
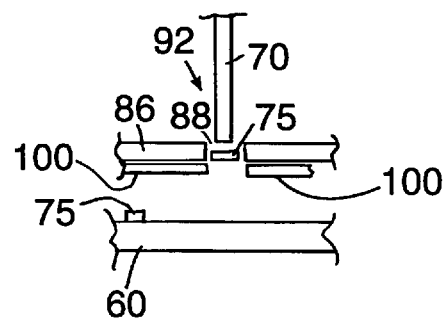
FIG. 9 is a side elevational view depicting the interface between an alternative embodiment of a chip transfer mechanism and the spindle in a first operational state.
Figure 10:
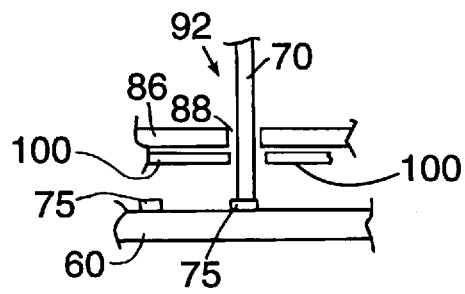
FIG. 10 is a side elevational view depicting the interface between the alternative embodiment of a chip transfer mechanism and the spindle in a second operational state.

If an exit shutter 104 is not used, as shown in the embodiment of FIGS. 9 and 10, the chip component 75 will be temporarily unsupported when it arrives at the delivery station 92. However, (i) the location of the bottom of the spindle 70 immediately above the component holding compartment 88 at the delivery station 92 and, (ii) the application of a vacuum to the spindle 70, the spindle 70 will engage the top of the chip component 75 and controls and retain it by its applied vacuum. Downward movement of the spindle 70 is then started upon command and the chip component 75 is placed on the substrate 60. The spindle 70 is then retracted and awaits the next chip component 75.

After one chip component 75 has been placed on the substrate 60, the next component 75 can be placed at the next desired site on the substrate 60 by merely repositioning the feeder and placement head 52 by the screw drives 57 and 59, rotating the transfer wheel 86, and controlling and placed the next chip component 75 on the substrate 60 with the spindle 70 at another desired location. It is noted that the transfer wheel 86 and the feeder and placement head 52 can be moved simultaneously to further reduce manufacturing time.

Further, the chip components 75 may also be inspected in their component holding compartments 88 at the receiving station 90, the delivery station 92, or at any stations 94 therebetween by sensors 106. If a sensor 106 determines that a chip component 75 is unacceptable, that chip component 75 can bypass the chip delivery station by not engaging the unacceptable chip component 75 with the spindle 70, and by not moving the exit shutter 104 and letting the unacceptable chip component 75 index pass the delivery station to a reject station. Further, if a sensor 106 determines the lack of presence of a chip component 75 in a component holding compartment 88, the transfer wheel drive system 107 can double index the appropriate number of times so to provide a chip component to the spindle 70 without the additional cycle time of moving spindle 70 through its vertical motion. Further, the presence of stations 94 between the chip receiving station 90 and the chip delivery station 92 permits the inspecting to be performed without any reduction in assembly time.

Depending upon the application, the component feeder and placement head 52 can be easily adapted to accept different chip component sizes or types. This provides the system with excellent adaptability for minimizing manufacturing time in a wide variety of circumstances. For example, if the assembly of a substrate 62 requires three different surface mount chip components 75, three separate component feeder and placement heads 52 can be mounted to base section 64 to place the three different type chip components 75 on the substrate 62. The three-feeder and placement heads 52 are efficiently moved above the circuit board 62 while the spindles 70 from each component feeder and placement head 66 place the chip components 75 at their desired locations under control of controller 108.

However, regardless of whether more than one component feeder and placement head 52 are utilized, it is evident that the feeder and placement head 52 does not have to shuttle away from the substrate 62 to a pick-up station, and thus the apparatus 50 of the present invention reduces considerable assembly time over conventional pick-and-place machines.

Additionally, because the feeder and placement head 52 is removably attached to base section 64, the apparatus 50 has enhanced reliability, reduced repair time, and quick and simple changeover time to restock chip components or change chip component sizes or types. Additionally, the container 74 on the feeders 68 are removably coupled to their respective body sections 76 so that an empty container can be easily replaced by a full container in a relatively short amount of time.

While the component feeder and placement head 52 is primarily designed for rectangular chip components with the longer side having a length between 0.039–0.079 inches, the shorter side having a length between 0.020–0.049 inches, and a thickness between 0.012–0.049, it should be recognized that this invention is not limited to chip component sizes within these ranges, and that chip components which fall outside this range could also be used.

While particular embodiments of the invention have been shown and described, it is recognized that various modifications thereof will occur to those skilled in the art. Therefore, the scope of the herein-described invention shall be limited solely by the claims appended hereto.

What is claimed is:

1. An apparatus for supplying chip components and placing the components on a substrate, said apparatus being structurally coupled for translationally movable with respect to the substrate, said apparatus comprising:

a component transfer mechanism, said transfer mechanism including a rotatable wheel with a plurality of component holding compartments, a plurality of angularly disposed stations, and a drive mechanism for sequentially moving the compartments to the stations, said stations including at least a component receiving station and a component delivery station;

a component feeder, said feeder having a container for storing a plurality of electrical chip components and feeding the components individually to the receiving station of the transfer mechanism;

a vacuum spindle, said vacuum spindle disposed above said delivery station of the transfer mechanism, said vacuum spindle being vertically movable with respect to the delivery station for controlling a component at the delivery station;

said transfer mechanism, said feeder, and said vacuum spindle being translatable for placement of components on a plurality of desired locations on the substrate; and wherein said component, when located at the delivery station, is only supported by the vacuum created in the vacuum spindle, said vacuum spindle controlling the placement of the component onto the substrate.

2. A method for supplying and placing chip components on a substrate, said method comprising the steps of:

providing a placement head having a transfer mechanism, a feeder, and a vacuum spindle, including a component storage container contiguous therewith;

individually aligning the components in the feeder and delivering said components to an exit point;

positioning the placement head at a first predetermined position above the substrate;

delivering a component from the feeder exit point to a compartment at a receiving station on the transfer mechanism;

rotating the transfer mechanism to move the component at the receiving station on the transfer mechanism from the receiving station, and to move a component to a delivery station on the transfer mechanism;

controlling the component at the delivery station of the transfer mechanism with the vacuum spindle;

placing the component at the delivery station onto the substrate with the vacuum spindle;

moving the placement head including the transfer mechanism, the feeder, and the vacuum spindle to a second predetermined position above the substrate and repeating said delivering, rotating, controlling and placing steps; and said component being only supported by the vacuum created in the vacuum spindle at the delivery station, the spindle being extendable through the compartment at the delivery station.

* * * * *